United States Patent [19]

Iwasaki et al.

[11] Patent Number: 5,266,152
[45] Date of Patent: Nov. 30, 1993

[54] METHOD OF ETCHING

[75] Inventors: Yasukazu Iwasaki, Yokosuka; Makoto Uchiyama, Miura, both of Japan

[73] Assignee: Nissan Motor Co., Ltd., Yokohama, Japan

[21] Appl. No.: 958,771

[22] Filed: Oct. 9, 1992

[30] Foreign Application Priority Data

Oct. 9, 1991 [JP] Japan .................... 3-261948

[51] Int. Cl.$^5$ .................... H01L 21/306; B44C 1/22
[52] U.S. Cl. .................... 156/626; 156/627; 156/628; 156/642; 156/657; 156/662; 252/79.3; 252/79.4
[58] Field of Search ............... 156/626, 627, 628, 642, 156/647, 657, 662; 252/79.3, 79.4

[56] References Cited

U.S. PATENT DOCUMENTS

| | | | |
|---|---|---|---|
| 3,592,773 | 7/1971 | Muller | 252/79.3 |
| 4,071,397 | 1/1978 | Estreicher et al. | 252/79.3 |
| 4,681,657 | 7/1987 | Hwang et al. | 156/657 |
| 4,971,654 | 11/1990 | Schnegg et al. | 156/638 |

FOREIGN PATENT DOCUMENTS 49-45035 12/1974 Japan .

Primary Examiner—William A. Powell
Attorney, Agent, or Firm—Foley & Lardner

[57] ABSTRACT

Disclosed is a method of etching comprising preparing an etching solution containing hydrofluoric acid and nitric acid, and etching while adding nitrite ion or a medium for producing nitrite acid ion to the etching solution. As the medium for producing the nitrite ion, silicon with a high impurity concentration, a mixed acid solution containing hydrofluoric acid and nitric acid having been used for dissolving a great amount of silicon, or gaseous nitrogen dioxide may be used. Preferably, the concentration of nitrite ion in the etching solution is detected based on the concentration of $NO_x$ in the gas phase which is in an equilibrium relation to the nitrite ion in the liquid phase of the etching solution, and necessary nitrite ion are added to the etching solution based on the concentration of $NO_x$.

13 Claims, 10 Drawing Sheets

METHOD OF ETCHING

BACKGROUND OF THE INVENTION

The present invention relates to a method of etching, particularly to a method of continuing stable etching.

It has been known to carry out selective (preferential) etching to silicon with a mixed acid containing hydrofluoric acid, nitric acid and acetic acid. As the mixed acid, there can be mentioned an etching solution containing these acid components at 1:3:12 in volume as developed by Dash for testing drawbacks in silicon materials. Moreover, it is now noted that the etching solution containing the acid components at 1:3:8 in volume is applicable to isotropic selective etching because the etching rate of the solution depends on the concentration of impurity contained in the crystal.

However, for such a selective etching solution, the etching properties tend to be changed and the etching are not well controlled. Therefore, Muraoka et al. proposed a method of controlling the selectivity by adding aqueous hydrogen peroxide to the etching solution (Japanese Patent Publication SHO 49-45035).

However, even by the Muraoka's method, etching reaction does not occur in the least in case of three-dimensional fine processing for intelligent sensors represented by the process for fabrication of acceleration sensors. Namely, the selective etching based on the above-mentioned method can not be applied to such three-dimensional fine processing.

Accordingly, the conventional etching method as described above can not be used for such selective etching as to satisfy the properties required for performing stable three-dimensional fine processing.

SUMMARY OF THE INVENTION

It is an object of the present invention to provide a method of etching with a mixed acid mainly containing hydrofluoric acid and nitric acid, which is applicable to fine processing with high stability and high accuracy on general wet treatment such as washing and etching.

To achieve the object mentioned above, the present invention provides a method comprising preparing an etching solution containing hydrofluoric acid and nitric acid, and etching while adding nitrite ion to the etching solution.

DETAILED DESCRIPTION OF THE PREFERRED EMBODIMENT

Figure 1:
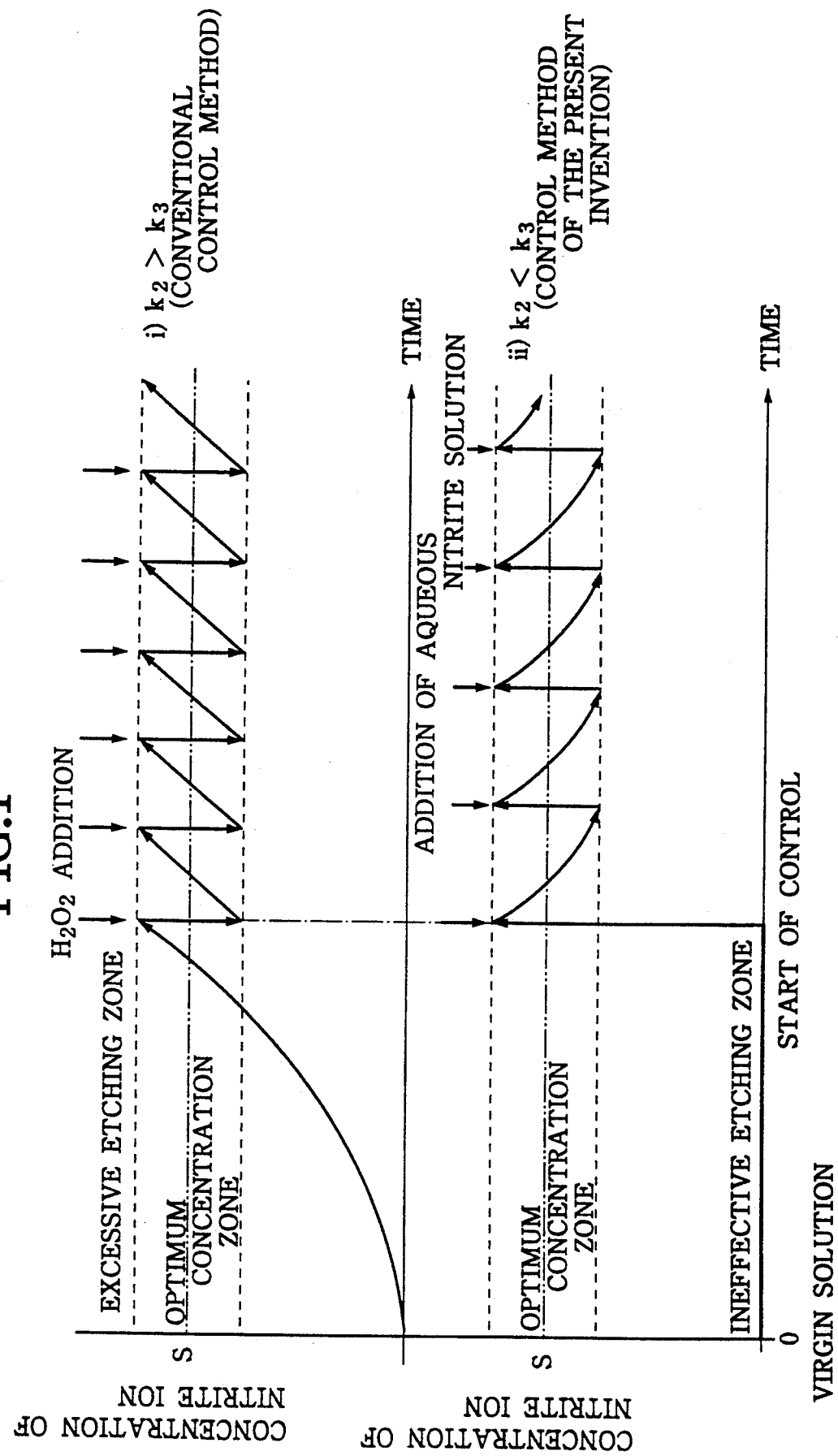
FIG. 1 is a diagram to show comparison between an etching method as an embodiment of the present invention and a conventional etching method.

First of all, we will explain the principle of the etching method according to the present invention.

Generally, the concentration change of the nitrite ion $dC/dt$ in the etching solution mentioned above can be expressed by the following formula (1):

$$dC/dt = k_1 C_0 + k_2 C - k_3 C \qquad (1)$$

In this formula (1), the first term on the right side shows the production rate of nitrite ion to be produced by the oxidation process of silicon by nitrate ion. $C_0$ is the concentration of nitrate ion, and can be considered to be virtually constant since these ions are present in a great amount in the etching solution. The coefficient $k_1$ is a parameter constant determined by parameters relating to conditions of the etching apparatus, such as stirring speed, etching temperature and the like, parameters to the semiconductor device to be etched, such as impurity concentration, volume and shapes of the sites to be selectively etched, and other parameters including the hole formation rate in silicon by the nitrate ion.

The second term on the right side shows the production rate of nitrite ion to be produced in the oxidation process of silicon in a manner of self-catalytic reaction by nitrite ion or lower-oxidation-number nitrogen compounds. The factor C is the concentration of nitrite ion, which is a variable likely to be changed, and $k_2$ is a parameter constant like $k_1$ depending on the nitrite ion.

Moreover, the third term on the right side shows the disappearance rate of nitrite ion to be lost by decomposition into gaseous substance due to the acidity of the etching solution. The coefficient $k_3$ is a parameter constant determined by the parameters relating to the etching apparatus, and others relating to the decomposition rate of nitrite ion or the gas-liquid distribution coefficient of the gaseous substance to be produced by the decomposition.

In formula (1), when the selective etching solution is a virgin solution, the second and third terms can be neglected because C is 0. Accordingly, with respect to the concentration change in formula (1) of nitrite ion at the beginning of etching by such a virgin solution, the first term is dominant. However, when C=0, almost no etching is seen. Therefore, dC/dt is not such a large value as to be considered. However, as the reaction proceeds, the concentration of nitrite ion in the first term is gradually increased. As the result, the second term becomes large, and then the third is increased.

Now, the optimum concentration of nitrite ion in the selective etching process is called $C_s$. Incidentally, the value of $C_s$ is a constant determined by the parameters concerning the semiconductor device to be produced and those concerning the etching apparatus or the like. In this case, $k_1 C_0 < k_2 C_s$ can be established, so that the first term can be neglected.

Accordingly, the etching reaction at $C = C_s$ depends on the following two cases:

$$k_2 > k_3 \text{ (in more detail; } k_1C_0+k_2C_s > k_3C_s) \quad (i)$$

$$k_2 < k_3 \text{ (in more detail; } k_1C_0+k_2C_s < k_3C_s) \quad (ii)$$

Namely, in case of (i), the concentration of nitrite ion increases approximately exponentially. This means that the etching rate increases excessively.

Meanwhile, in case of (ii), the concentration of nitrite ion decreases exponentially, so that the etching reaction is almost stopped.

Usually, the conventional selective etching is carried out under the condition (i). In such a case, it is necessary to remove excessive nitrite ion to be produced in a self-catalytic manner. The above-described technique developed by Muraoka et al. is one of the methods required for controlling such selective etching. Namely, according to the Muraoka's method, the excessive nitrite ion is removed by oxidizing it into nitrate ion by aqueous hydrogen peroxide. Of course, the effect of the third term in formula (1) becomes neglectable because the effect of the second term is controlled by the removal of excessive nitrite ion.

However, the isotropic selective etching is not always carried out under the condition (i). Namely, even if the parameters of the etching apparatus are kept under the condition (i), it is possible that the relation between the parameter constants $k_2$ and $k_3$ becomes the state shown by (ii) by the parameters of the semiconductor device to be produced.

For example, the isotropic selective etching of the present invention applies to the case. Namely, the etching process of our invention is used for producing intelligent sensors in which the volume of sites to be etched must be about one-tens of thousandths as compared with the process for producing IMPATT diodes or wrapping silicon substrates. As the sites to be etched become so fine as mentioned above, the parameters of the semiconductor device to be produced should be largely changed. As the result, the parameter constants $k_1$ and $k_2$ become extremely small as compared with the conventional values, so that the relation between the parameter constants $k_2$ and $k_3$ becomes the state (ii), and the third term in formula (1) can no longer be neglected.

To keep the concentration of nitrite ion at an optimum value in such an isotropic selective etching, it is necessary to feed nitrite ion corresponding to the decomposition into gaseous substance.

If the feed rate is now designated by A, the concentration change of nitrite ion can be expressed as follows:

$$dC/dt = k_1C_0 + k_2C_s - k_3C_s + A \quad (2)$$

Because $dC/dt=0$ when C is constant, A is adjusted as follows:

$$A = k_3C_s - k_1C_0 - k_2C_s \quad (3)$$

Accordingly, if a plot of the change of nitrite ion is prepared in advance, it becomes possible to control the concentration C at a constant value without any trouble for staged titration accompained by concentration measurement of the nitrite ion. For example, as is seen from FIG. 4, the control can be achieved by adding 1.0 ml of aqueous potassium nitrite solution (1 mol/l) and then adding 0.5 ml of the same solution every 40 minutes as half-value period.

FIG. 1 shows comparison between the method of the present invention and the Muraoka's method. Incidentally, when $k_2$ and $k_3$ are substantially equal, it is not necessary to control the concentration of nitrite ion. In fact, the control operation must be required because $k_1$ and $k_2$ change (decrease in general) with progress of the etching process.

In the description above, the concentration change is considered based only on the primary reaction. However, even if the other reactions possible in the etching reaction are taken into account, the result does not differ so much from the specific case.

Moreover, the first, second and third terms are not independent respectively. Namely, each term is determined by the other terms. This is because many reaction elements are present in the etching system, and each element does not work independently, but has some influence on the others to establish an equilibrium relation.

Even under the condition (i), the concentration of nitrite ion does not continue to increase. Namely, when the value increases up to a limit, the concentration change reaches the rate-determining step and the reaction goes in an equilibrium state. However, the maximum value is far greater than the optimum concentration of the etching system, thus such a state around the rate-determining step is not considered here.

Meanwhile, the method of controlling isotropic selective etching under the condition (ii) can be carried out not only by directly adding nitrite ion with aqueous solution of nitrite or nitrous acid, but also by using a medium for indirectly producing the nitrite ion, such as various metals or silicon itself. It is also possible to add a mixed acid consisting of hydrofluoric acid and nitric acid, which is already used for dissolution of a great amount of silicon. Hereinafter we call such a mixed acid "used solution." Moreover, it is also effective to flow nitrogen dioxide gas through the etching solution because the gas produces nitrite ion by the ionization equilibrium in the etching solution.

Unlike the method using nitrite, the methods of adding silicon, nitrogen dioxide, aqueous solution of nitrous acid and used solution do not contain alkaline metals (Na, K or the like). Therefore, these alkaline-metal-free methods are applicable to such a process that contamination caused by the alkaline metals must be questioned. As the process where such contamination becomes a fatal problem, there can be mentioned a process in which three-dimensional processing by the selective etching is conducted prior to production of devices such as bipolar transistors or CMOS. Of course, it is not necessary to consider the influence of such contamination in the process of producing usual intelligent sensors, because the circuit portions are formed prior to the three-dimensional processing.

For the detection of the concentration change of nitrite ion, measurement of $NO_x$ (including NO, $NO_2$ and the like nitrogen-containing gaseous substance) in the gas phase which is in an equilibrium relation to the nitrite ion in the liquid phase is preferable to direct measurement of the nitrite ion. This is because the monitorring of the concentration of $NO_x$ does not require to dip the metal electrodes directly in the etching solution so that the contamination by the electrodes can be avoided. Moreover, in such a method, a proper addition amount of nitrite ion can be so determined as to adjust the monitored concentration of $NO_x$ at a predetermined constant value. As the result, it becomes possible to realize a more clean and stable etching process. For example, in case where a Pt-electrode and an Au-electrode are dipped in an etching solution, when analyzing the etching solution by the graphite furnace absorptiometry after one week, Au is detected at about 4 ppb.

In addition, the method of measuring the concentration of $NO_x$ is not affected by additives such as surfactant and the like materials for improving the etching properties. Therefore, the concentration change of nitrite ion can be grasped with good precision.

Hereinafter, the principle of the method will be explained.

Between the nitrite ion in the liquid state and $NO_x$ in the gas state, there is the following equilibrium relation:

$$2H^+ + 2NO_2^- \rightleftharpoons 2HNO_2 \rightleftharpoons NO + NO_2 + H_2O$$

As clearly seen from the equilibrium relation, in such a selective etching solution as represented by a mixed acid containing hydrofluoric acid, nitric acid and acetic acid at the ratio of 1:3:8 in volume, the concentration of hydrogen ion ($H^+$) is extremely high so that almost all of the nitrite ion ($NO_2^-$) is present in the form of nitrous acid ($HNO_2$) in the etching solution.

Moreover, the nitrous acid ($HNO_2$) is in an equilibrium relation to the nonionic gaseous substance $NO_x$, i.e., nitrogen monoxide and nitrogen dioxide being distributed in the liquid and gas phases respectively.

Therefore, the concentration change of nitrite ion can be detected indirectly from the detection of the concentration change of $NO_x$ in the gas phase.

In parallel with the equilibrium relation, the nitrous acid ($HNO_2$) decomposes as shown in the following formula:

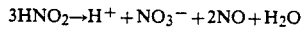
$$3HNO_2 \rightarrow H^+ + NO_3^- + 2NO + H_2O$$

Hereinafter, we explain an embodiment of the etching method according to the present invention with reference to the drawings.

Figure 2:
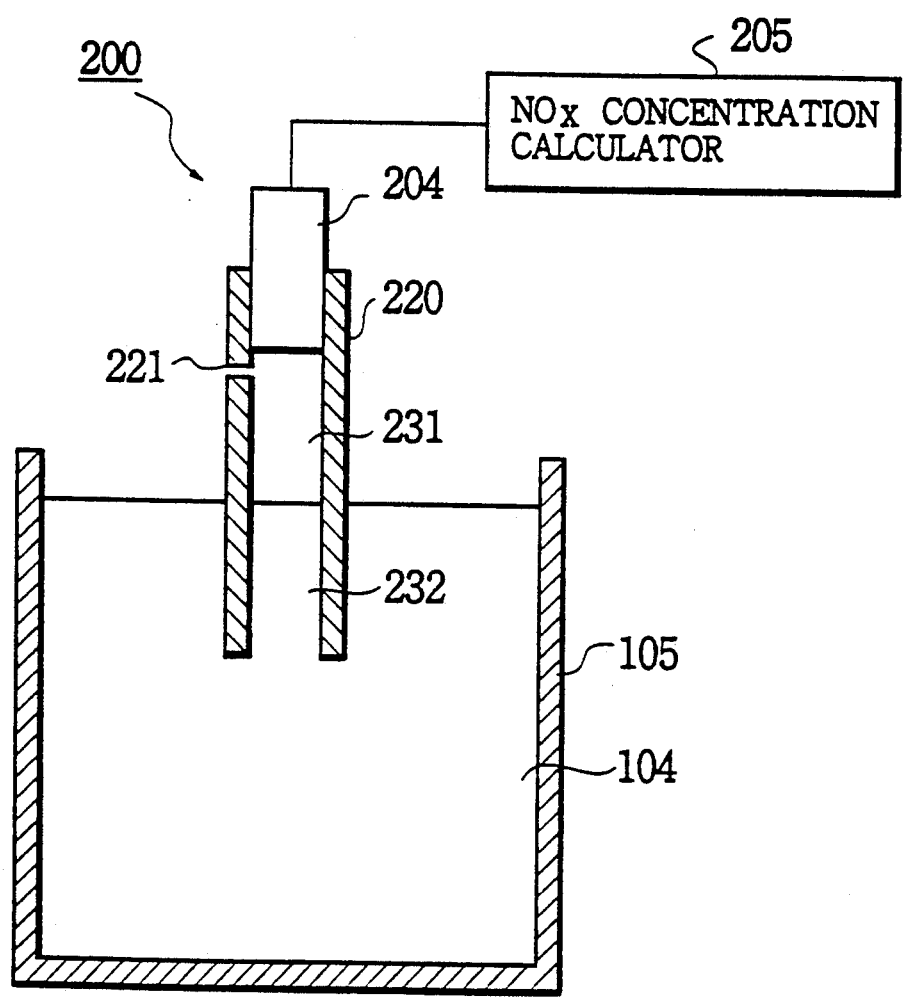
FIG. 2 shows etching apparatus used for performing the method as the embodiment of the present invention.

FIG. 2 shows an etching apparatus to perform an embodiment of the method according to the present invention.

As shown in the same drawing, the apparatus comprises an etching chamber 105 filled with an etching solution 104, and a monitor device 200.

The monitor device 200 comprises a tubular member 220 which is composed of a material with high etching resistance such as teflon (politetrafluoroethylene) and is dipped into the etching solution 104 at the lower end portion thereof, an $NO_x$ detector 204 fitted in the upper end portion of the member 220, and a meter 205 for calculating the concentration of $NO_x$ based on the output from the detector 204. Incidentally, the interior of the tubular member 220 is divided into a gas phase portion 231 and a liquid phase portion 232. Moreover, the tubular member 220 is provided with an opening 221 through which the gas phase portion communicates with the outside air so as to adjust the gas phase 231 at the atmospheric pressure.

According to the etching apparatus, the concentration of $NO_x$ in the gas phase 231 can be monitored by the monitor 200 through the detector 204 and calculator 205. As the result, the concentration change of nitrite ion of the etching solution 104 can be grasped through a proper calculation based on the data obtained by the monitor 200. Therefore, it becomes possible to control the concentration of nitrite ion at a desired constant value by adding an appropriate amount of nitrite ion to the etching solution 104 in accordance with the calculation on the concentration change.

In more detail, in the etching system described above there is the following equilibrium relation with respect to the nitrite ion:

$$2H^+ + 2NO_2^- \rightleftharpoons 2HNO_2 \rightleftharpoons NO + NO_2 + H_2O$$

Accordingly, if the above-mentioned selective etching solution containing hydrofluoric acid, nitric acid and acetic acid at 1:3:8 in volume is used as the etching solution 104, the equilibrium relation shifts from the side of nitrite ion ($NO_2^-$) to the side of nitrous acid ($HNO_2$) because extremely high concentration of hydrogen ions ($H^+$) are present in such a system.

Moreover, the nitrous acid ($HNO_2$) are in an equilibrium relation to the nonionic gaseous substance $NO_x$, i.e., nitrogen monoxide and nitrogen dioxide being distributed in the liquid and gas phases respectively.

Therefore, the concentration change of nitrite ion can be detected indirectly from the detection of the concentration change of $NO_x$ in the gas phase.

Incidentally, in this method, it is not necessary to dip metal electrodes into the etching solution as required in the conventional method, and only the tubular member having high etching resistance is dipped into the solution. Therefore, contamination of the etching solution caused by the electrodes can be prevented.

Moreover, the detection system is not affected by additives to be added to the etching solution for improving the etching properties or the like aim, purpose the monitoring can be performed with high accuracy.

Next, we explain a process in which the selective etching method according to the present invention is carried out to a silicon substrate to form a beam usually adopted in pressure sensors or the like apparatus.

Figure 3A:
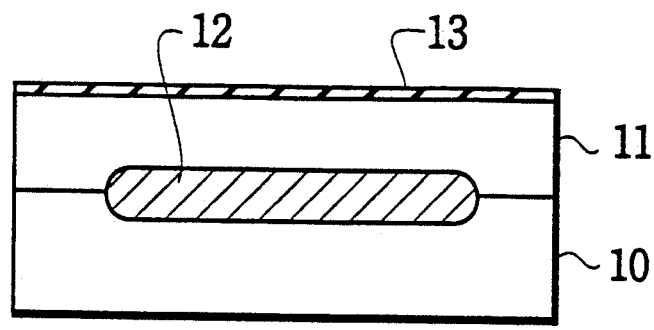
FIGS. 3A to 3D show a process for producing a semiconductor device, in which the etching method as the embodiment is adopted.

First, as shown in FIG. 3A, a buried layer 12 with a high impurity concentration is formed by diffusion in an silicon substrate 10 with a low impurity concentration. On the buried layer 12 a silicon layer 11 with a low impurity concentration is formed by epitaxial growth. Moreover a silicon oxide film 13 is formed as a protective layer on the surface of the silicon layer 11.

Figure 3B:
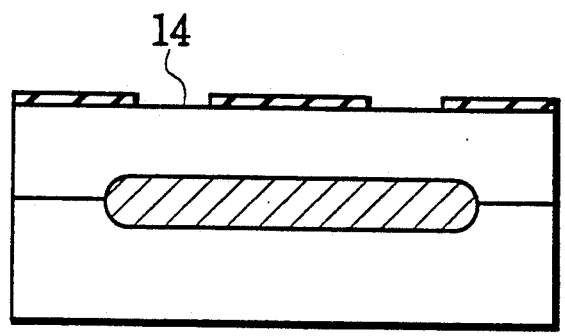

Then, as shown in FIG. 3B, openings are formed in the silicon oxide film 13 by photolithoetching.

Subsequently, vertical grooves 15 with a 30 to 50 μm width are formed through the buried layer 12 by a reactive ion etching using the silicon oxide film 13 as a mask.

Thereafter, the silicon substrate is dipped in the etching solution 104 (containing 49% hydrofluoric acid, 61% nitric acid and 99.5% acetic acid at the ratio of 1:3:8 in volume) filled in the etching apparatus shown in FIG. 2. As the result, the buried layer 12 can be selectively removed due to the difference of the impurity concentration, so as to form a hollow portion 16 as shown in FIG. 3D. Thus, a beam consisting of single-crystal silicon with a 20 to 50 μm in width can be formed.

As described above, in this process, the concentration of nitrite ion is detected indirectly by detection of the concentration of $NO_x$ in the gas phase using the monitor device. Moreover, the selective etching is carried out with adding aqueous solution of sodium nitrite ($NaNO_2$ 1 mol/l) corresponding to the detection data. Eventually, the aqueous nitrite solution (1 mol/l) is added every 10 to 30 minutes to 1.2 liters of the etching solution.

By adding the aqueous nitrite solution in such a manner, substantially the same amount of nitrite ion as that of the nitrite ion lost in the reaction can be recovered, so that the etching rate can be controlled at a constant value.

Figure 4:
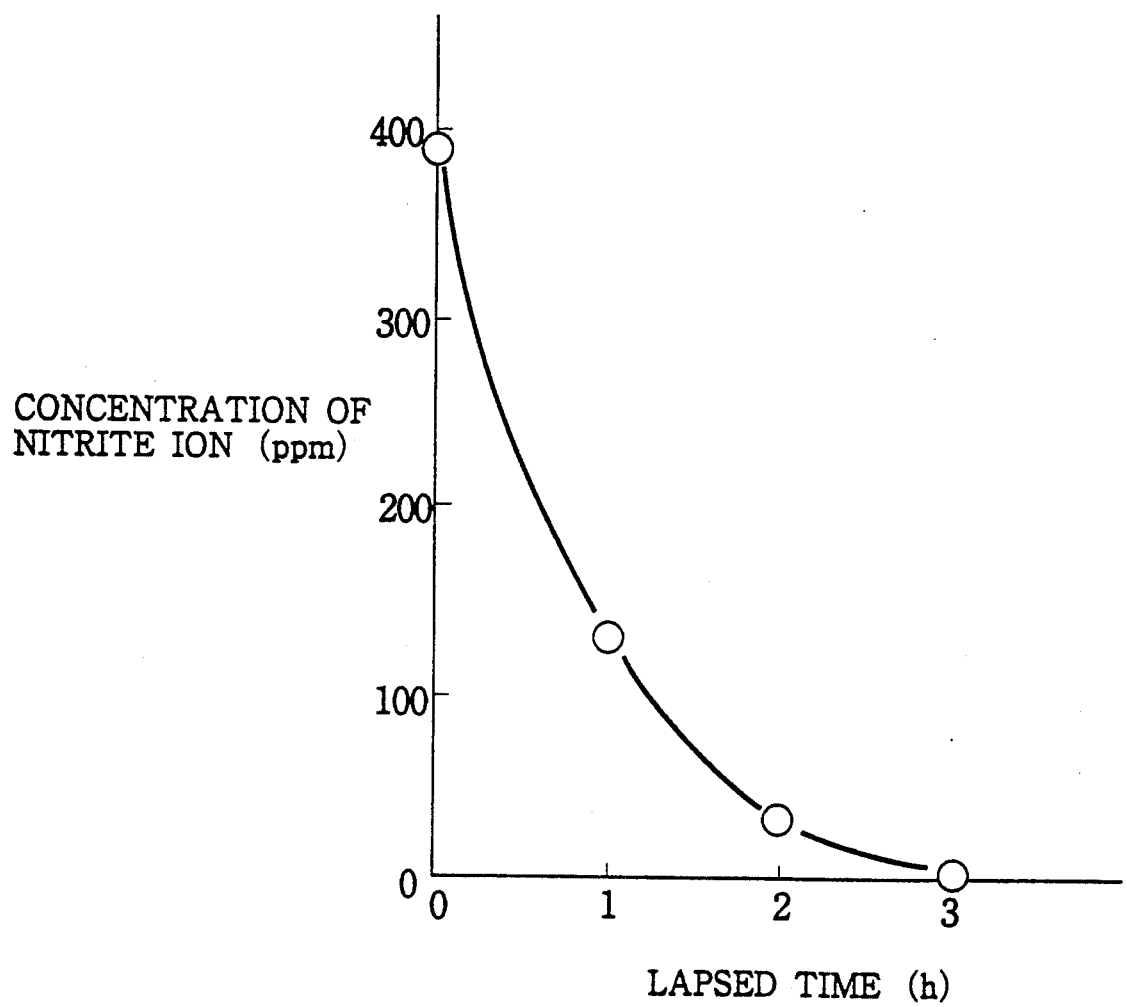
FIG. 4 is a diagram to show change of the concentration of nitrite ion with time in the event that a nitrite is added to the etching solution.

FIG. 4 shows the concentration change of nitrite ion with time in the same selective etching solution as used in the process mentioned above. In more detail, the same drawing shows a case where 1 ml of aqueous nitrite solution (1 mol/l) is added to 100 ml of the selective etching solution containing 49% hydrofluoric acid, 61% nitric acid and 99.5% acetic acid at 1:3:8 in volume. Thereafter, samples just after, 1 hour later, 2 hours later and 3 hours later after the addition are respectively taken out by 1 ml from the etching solution, and then analyzed by the colorimetry.

As seen from FIG. 4, the nitrite ion decreases to half the initial amount about 40 minutes later after the addition, and almost all of them are lost in 2 to 3 hours. Accordingly, to control the concentration of nitrite ion at an approximately constant value during the selective etching process, it is necessary to adjust the amount of the aqueous nitrite solution to be added at the amount of decrease.

Next, an experiment will be explained hereinafter which was conducted in order to examine the effect in case that the aqueous nitrite solution is added in the selective etching solution. Namely, the experiment was conducted in order to examine the change of the etching rate of the selective etching solution depending on the concentration of impurity by adding the aqueous nitrite solution in the selective etching solution.

FIGS. 5A to 5E are explanatory views showing a test element group (TEG) used for the experiment. The etching process will be explained along FIGS. 5A to 5B hereinafter.

Figure 5A:
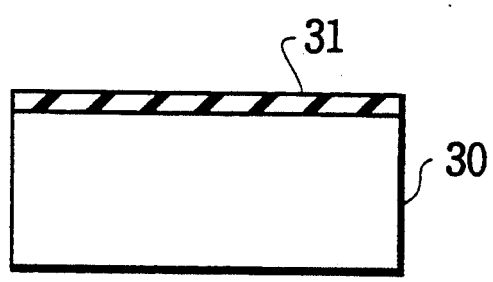
FIGS. 5A to 5E are explanatory views showing a test element group (TEG) used for an experiment.

First, as shown in FIG. 5A, a silicon oxide film 31 was formed on the surface of a silicon substrate 30.

Figure 5B:
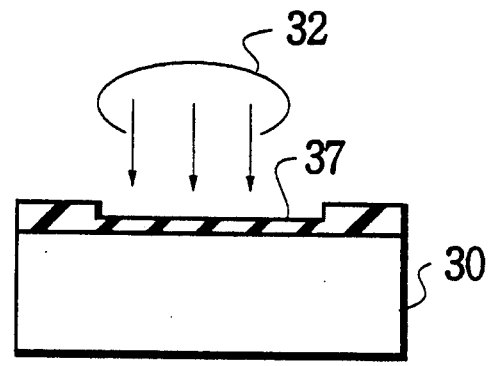

Then, as shown in FIG. 5B, an opening was formed in the silicon oxide film 31 to form a protective silicon oxide film, and then ion implantation 32 was carried out.

Figure 5C:
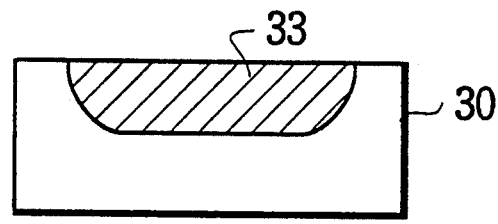

Thereafter, as shown in FIG. 5C, the silicon substrate 30 was subjected to heat diffusion for such a long time as to form a diffusion layer 33 having a relatively deep diffusion portion.

Figure 5D:
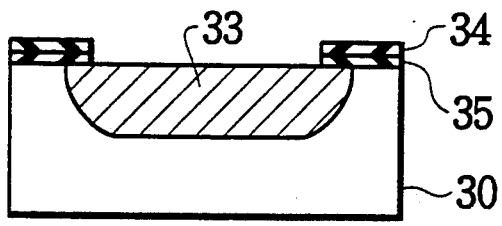
Figure 5E:
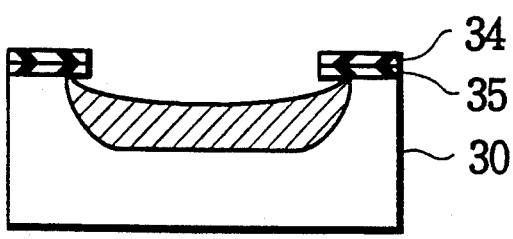

Subsequently, as shown in FIG. 5D, a silicon oxide film 35 and a silicon nitride film 34 were formed on a portion of the surface of the silicon substrate 30, and then an opening was formed in the silicon oxide film 35 and the silicon nitride film 34. Thus, the production of the TEG was completed.

Five kinds of TEG were produced by changing the volume of ion implantation, in which the concentration of impurity of the surface of silicon were within the range from $2 \times 10^{17}$ cm$^{-3}$ to $1.5 \times 10^{19}$ cm$^{-3}$.

Since the concentration of aqueous nitrite ion was changed every moment after the addition of the nitrite as described above, the experiment was efficiently conducted in a short time of one minute as etching time. This was also to conduct the experiment with using TEG in which the grade of the concentration of impurity of the surface of silicon was considered to be constant, because various TEG with various concentration of impurity were produced by the diffusion of impurity.

The produced TEG were dipped in the selective etching solution (1.2 l) of containing the acid components at 1:3:8 to etch the TEG. The selective etching were conducted in various condition that various amount of aqueous nitrite solution (1 mol/l) in the range from 0 to 20 ml were added in the selective etching solution. After that, the depth of etching were measured by the tracer method.

Figure 6:
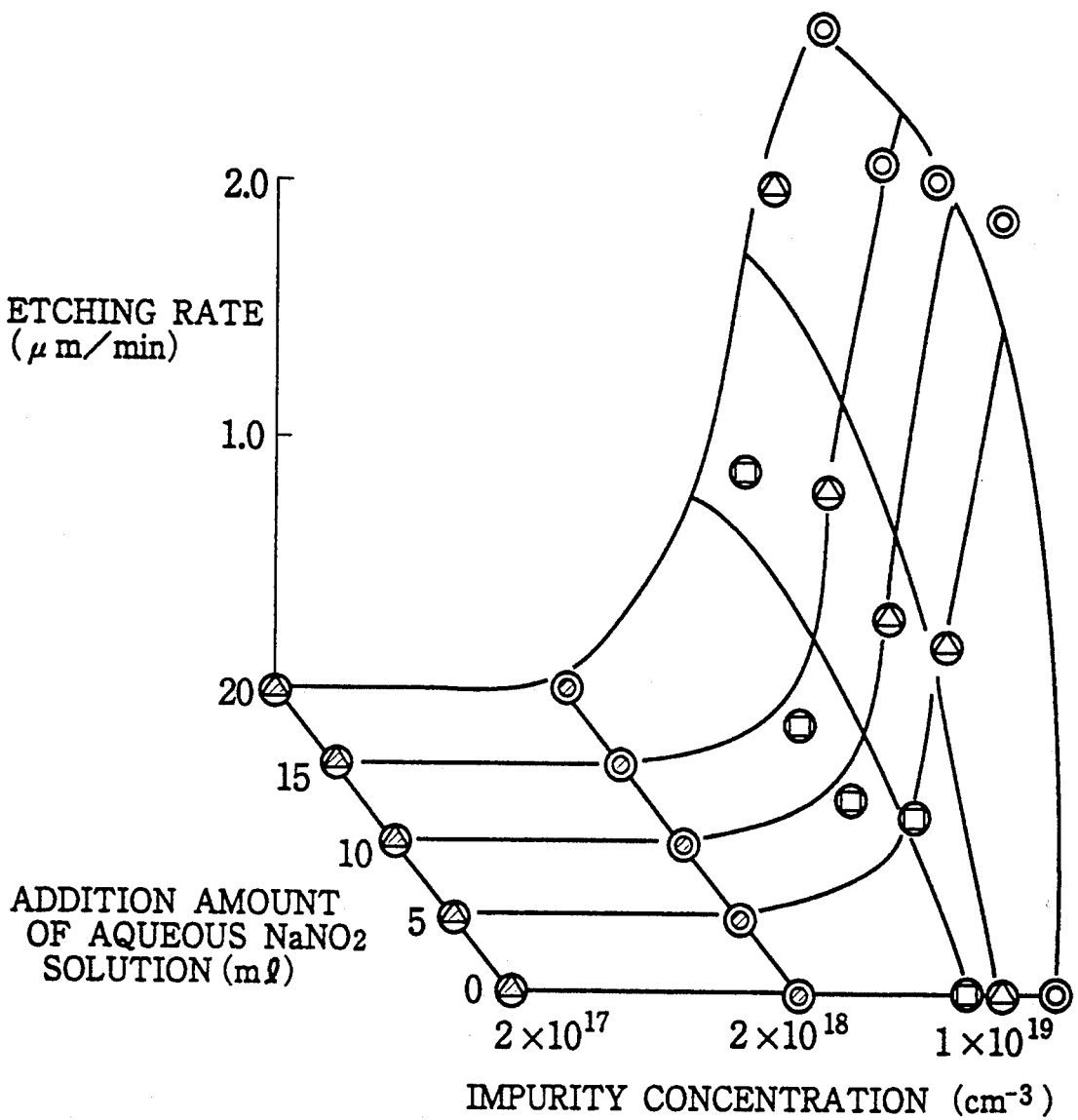
FIG. 6 shows a relation of the addition amount of aqueous nitrite solution, impurity concentration and etching rate in the etching method as the embodiment.

The result of the above experiment is shown in FIG. 6. As seen from FIG. 6, in case where aqueous nitrite solution was not added in the selective etching solution, none of TEG were etched. In contrast, in case where aqueous nitrite solution was added in the selective etching solution, the more the aqueous nitrite solution was added and the higher the impurity concentration becomes, the more the etching rate increases.

Figure 3C:
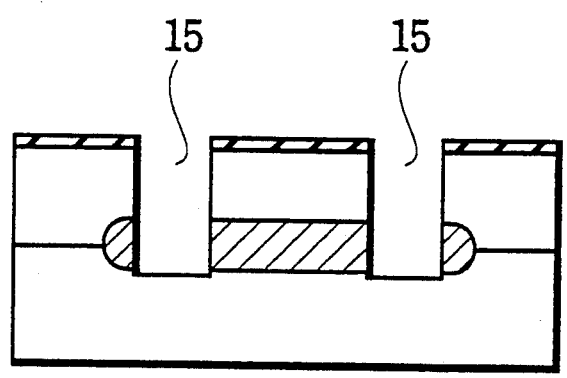
Figure 3D:
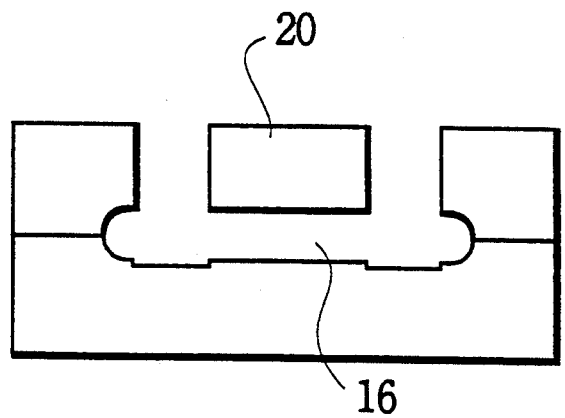
Figure 7:
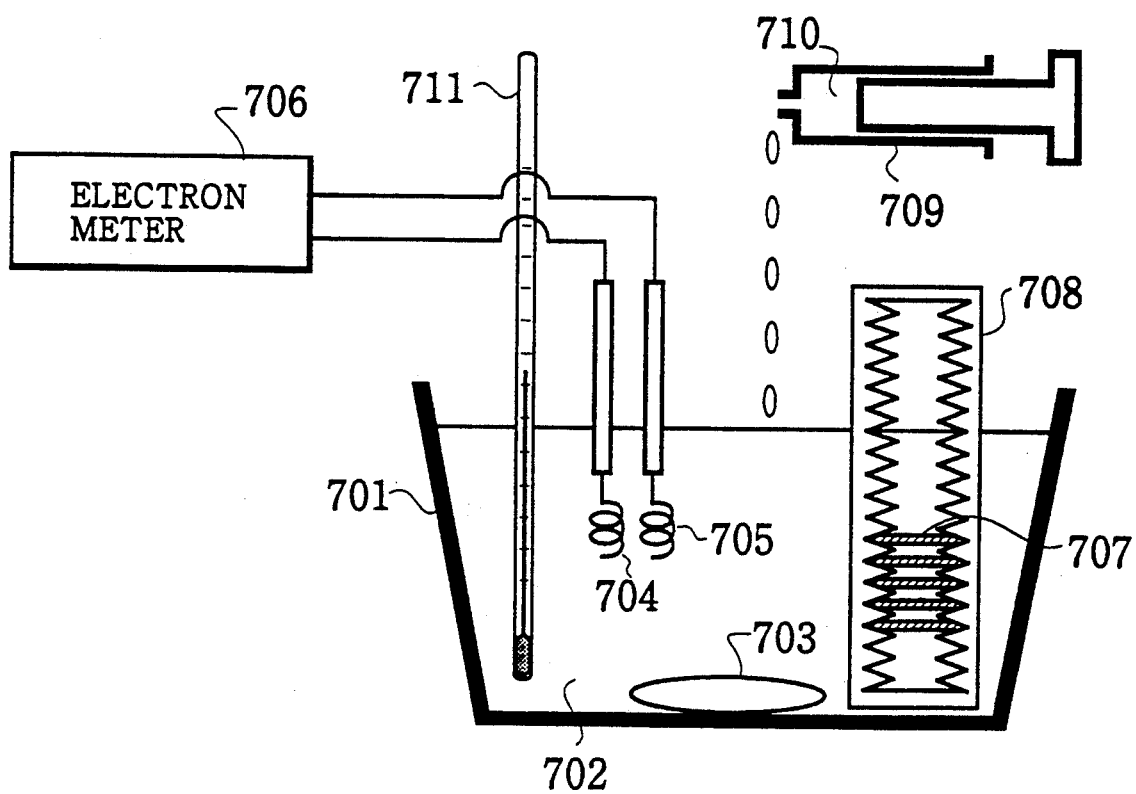
FIG. 7 shows an experimental equipment used to etch the test element group shown in FIG. 3C to form the silicon substrate shown in FIG. 3D.
Figure 8:
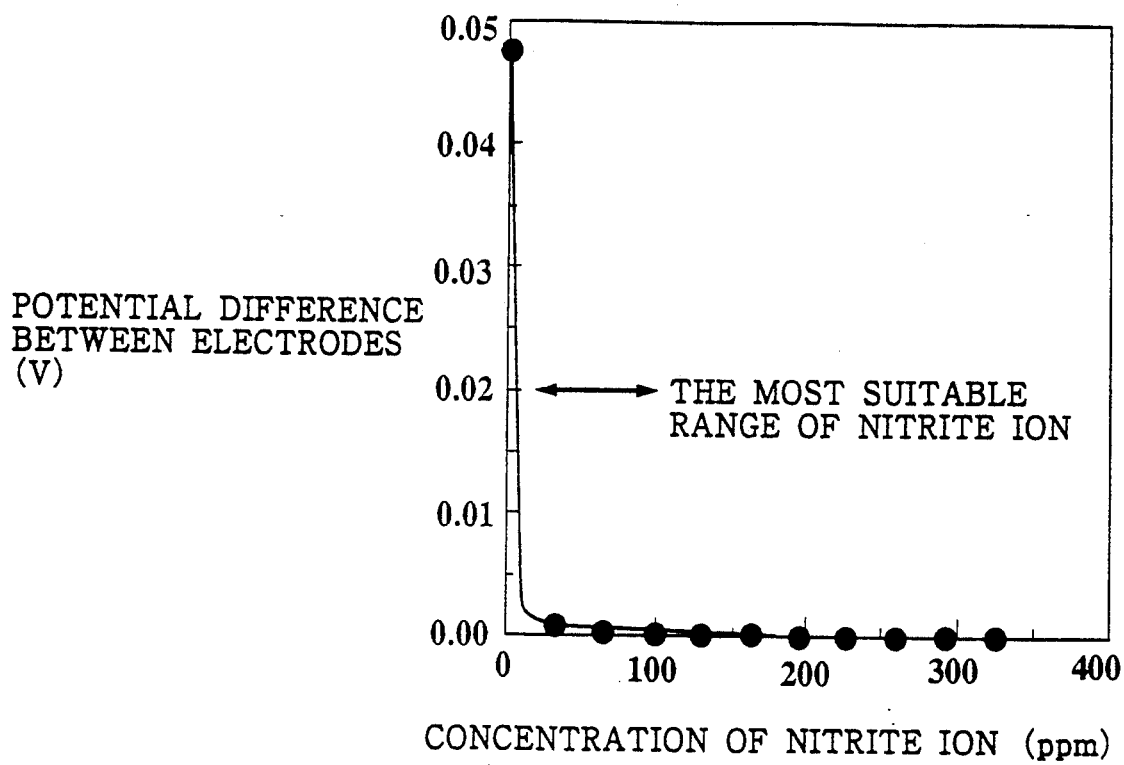
FIG. 8 shows the correlation between a potential difference between electrodes and a concentration of nitrite ion in a selective etching solution.

FIG. 7 shows the experimental equipment used to etch the test element group (TEG) shown in FIG. 3C to form the silicon substrate shown in FIG. 3D. As shown in FIG. 7, a teflon beaker 701 is filled with the selective etching solution 702, which was stirred by a stirrer bar 703. A Pt-electrode 704 and Au-electrode 705 were dipped in the selective etching solution 702, and the potential difference between the electrodes 704, 705 was detected by an electron meter 706. FIG. 8 shows the correlation between the potential difference between the electrodes 704, 705 and the concentration of nitrite ion in the selective etching solution 702. A plurality of silicon substrates 707 of TEG having the structure shown in FIG. 3C were held by a jig 708 and were dipped in the selective etching solution 702 to etch the TEG. After that, aqueous nitrite solution (1 mol/l) 710 was added by syringe pump 709. In addition, reference numeral 711 designates a thermometer.

The result of the above experiment will be described herein after.

First, in case where aqueous nitrite solution 710 was not added in the selective etching solution 702, the etching was not observed, although the experiment was conducted in the dip time range from 10 min to 6 hours of the silicon substrate 707 in the selective etching solution 702. Consequently, the hollow portion 16 shown in FIG. 3D was not formed. In this case, the potential difference between the electrodes 704, 705 was about 50 mV (refer to FIG. 8).

Next, the experiment was conducted with adding aqueous nitrite solution (1 mol/l) 710 by stud titration such that the potential difference between the electrodes 704, 705 became 0 mV. In this case, only a portion having high impurity concentration was selectively etched as shown in FIG. 3D. As a result, the hollow portion 16 shown in FIG. 3D was formed. In this case, the etching rate in a lateral direction in FIG. 3D was 30 μm par about 3 hours, that was 5 μm/h.

In the above stud titration, the aqueous nitrite solution 710 was added in the selective etching solution 702 to the degree 0 mV of the potential difference between the electrodes 704, 705. Since the potential difference between the electrodes 704, 705 increased as nitrite ion in the selective etching solution 702 was disappeared as time passed, aqueous nitrite solution was added again to the degree 0 mV of the potential differential between the electrodes 704, 705. Through such addition of the aqueous nitrite solution 710, it is possible to control the concentration of nitrite ion in the selective etching solution 702 within the range from several tens to 100 ppm. In this experiment, 1 ml of the aqueous nitrite solution 710 was necessary to be added in 1.2 l of the selective etching solution 702 every 10 to 30 minutes.

FIG. 8 shows the correlation between the potential difference between the electrodes 704, 705 immediately after the addition of aqueous nitrite solution 710 in the selective etching solution 702 and the concentration of nitrite ion in the selective etching solution 702. The hydrofluoric acid in the selective etching solution 702 was masked by boric acid, and sulfanilic acid was diazotized by nitrite ion in the selective etching solution 702 and coupled with α-naphthyl amin to form 4-amino-1-naphthylazobenzene-p-sulfonic acid. The concentration of nitrite ion in the selective etching solution 702 was detected by measuring absorbancy of the above 4-amino-1-naphthylazobenzene-p-sulfonic acid.

Since nitrite ion in the selective etching solution 702 is disappeared as time passed as described above, the experiment is necessary to be conducted efficiently. In addition, the method for monitoring the concentration of nitrite ion in the selective etching solution with the potential difference between Pt-electrode and Au-electrode or graphite electrode is described in a publication of Asano et al.: selective etching on silicon: the forth symposium regarding manufacturing technique of semiconductor and integrated circuit: the institute of electrical technique (1973) 16.

Incidentally, as the method of detecting the concentration of $NO_x$, there can be mentioned electrochemical methods such as controlled potential electrolysis, optical methods based on infrared-absorbing analysis method or visible region absorptiometric method, and electric methods as employing semiconductor detectors. Moreover, two or more detectors may be used for monitoring NO and $NO_2$ separately.

Figure 9:
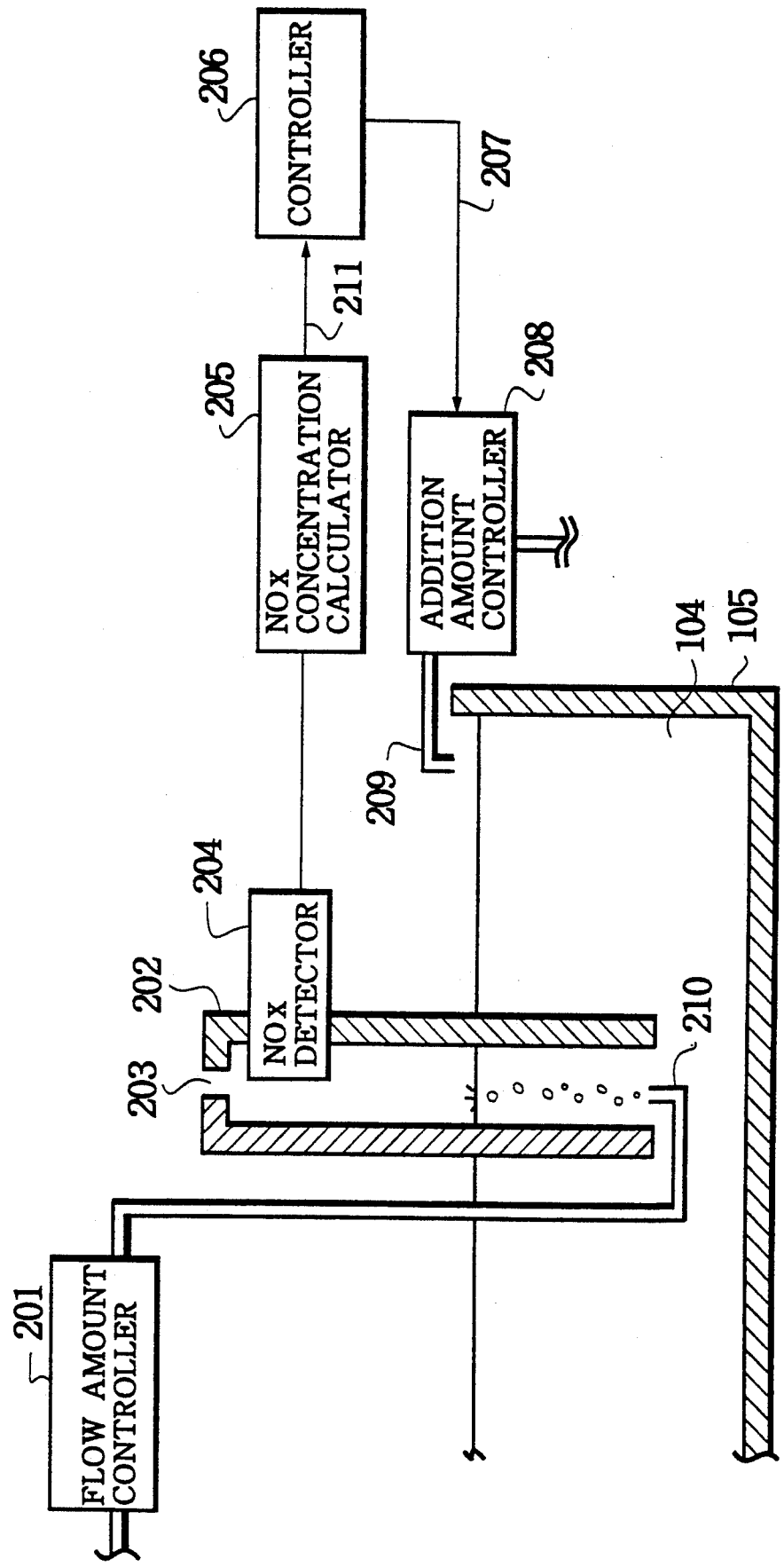
FIG. 9 shows another etching apparatus for performing the method as the embodiment of the present invention.

To enhance the accuracy of detection of the nitrite ion, it is also effective to elevate the pressure of $NO_x$ by compulsorily transferring $NO_x$ from the liquid phase to the gas phase with a flow of a carrier gas through the liquid state. FIG. 9 shows apparatus which is so designed as to utilize the effect of such a carrier gas. Namely, the apparatus comprises a gas flow controller 201 with a nozzle 210 extending under the bottom portion of a tubular member 202. Therefore, it is possible to feed inert gas (or carrier gas) such as nitrogen gas into the tubular member 202 from the nozzle 210 through the flow controller 201. When the carrier gas flows through the etching solution 104 in such a manner, the gas-liquid equilibrium with respect to $NO_x$ shifts toward the gas phase. As the result, $NO_x$ contained in the etching solution 104 is compulsorily transferred to the gas phase.

Thereafter, the concentration of $NO_x$ is detected by a detector 204. Then a signal 211 for indicating the concentration of $NO_x$ is obtained by a calculator 205 based on the output from the detector 204. Signal 211 is then transferred to a controller 206, and a control signal 207 is produced. Subsequently, signal 207 is introduced into an addition-amount controller 208, and a proper amount of aqueous nitrite solution is added to the etching solution 104 based on signal 207.

According to this apparatus, since the gas phase is compulsorily controlled at high pressure, the sensitivity in detection to the change of gaseous components is enhanced, so that it becomes possible to add a more suitable amount of nitrite ion to the etching solution in response to the detection result.

Figure 10:
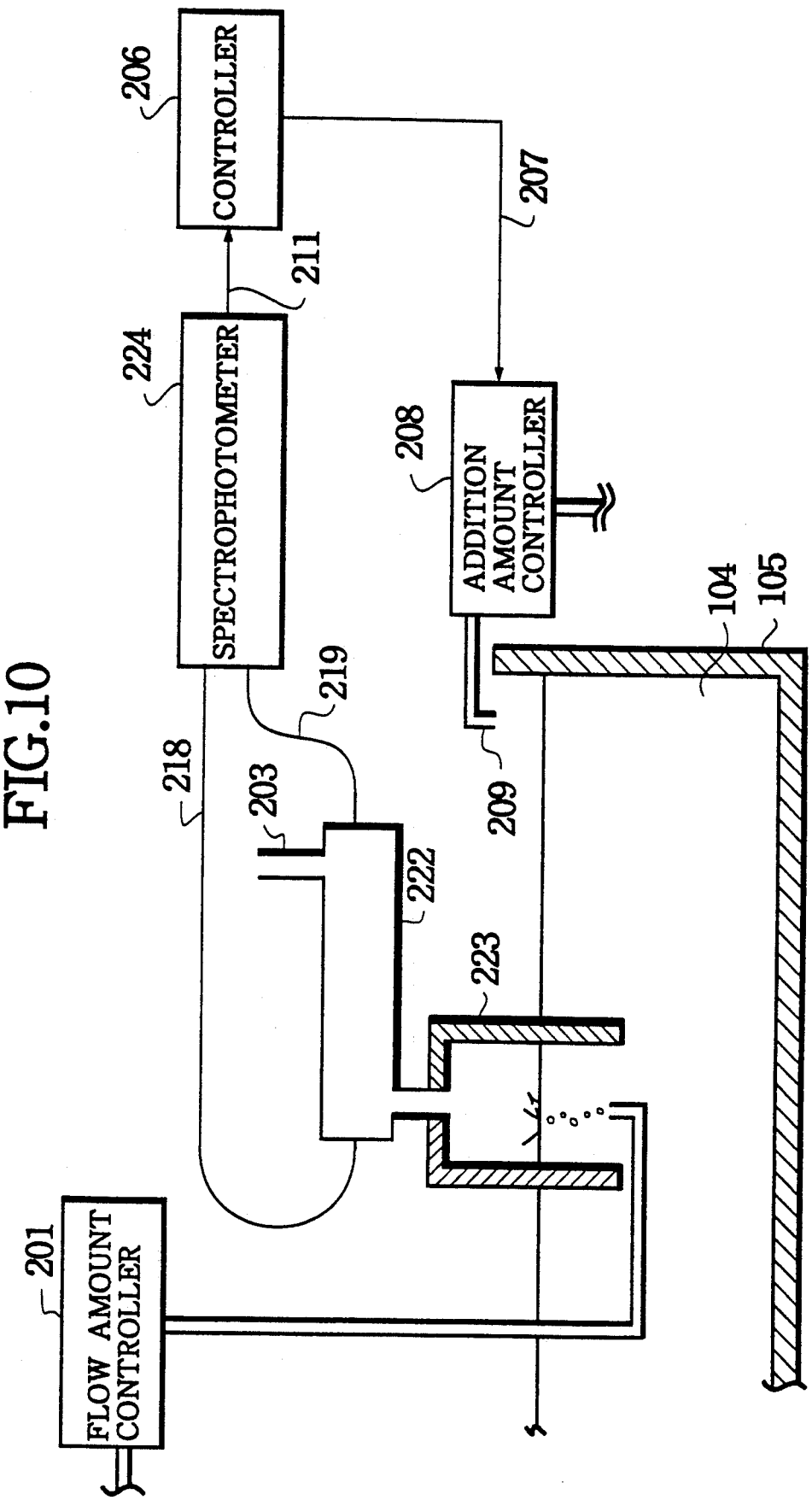
FIG. 10 shows still another etching apparatus for performing the method as the embodiment.

FIG. 10 shows another type of apparatus designed to utilize the same effect of carrier gas as mentioned above. In this apparatus, however, the detector 204 of the apparatus in FIG. 9 is replaced by an optical detector for performing optical detection of $NO_x$. The optical detector is disposed over a tubular gas collector 223 and comprises an absorbance cell 222 having optical fibers 218, 219 at both sides thereof and a spectrophotometer 224.

According to the optical detector, the change of $NO_x$ of the gas phase in the tubular member 223 is detected as change of absorbance by the spectrophotometer 224 through the absorbance cell 222 and fibers 218, 219. As the result, a signal 211 is transmitted from the spectrophotometer 224 to a controller 206, and a control signal 207 is produced. Subsequently, signal 207 is introduced into an addition-amount controller 208, and a proper amount of aqueous nitrite solution is added to the etching solution 104 based on signal 207.

Accordingly, this apparatus can also enhance the sensitivity to change of $NO_x$ as in the apparatus of FIG. 9.

Moreover, it is also possible to use gaseous nitrogen dioxide as such a medium for producing the nitrite ion by ionization equilibrium.

In addition, though the mixed acid used in the embodiments described above contains hydrofluoric acid, nitric acid and acetic acid, it is possible to use a mixed acid mainly containing hydrofluoric acid and nitric acid.

In summary, the concentration of nitrite ion in the conventional etching method tends to increase exponentially as typically shown in FIG. 1. Therefore, the etching rate increases steeply to excess, so that it is difficult to carry out stable etching.

Meanwhile, according to the etching method of the present invention, though the concentration of nitrite ion tends to decrease exponentially as also shown in FIG. 1, the loss of the ion during the etching process can be compensated with good accuracy by controllably adding aqueous nitrite solution or medium for indirectly generating nitrite ion to the etching solution. Thus, it becomes possible to continue etching in a stable state.

Various modifications will become possible for those skilled in the art after receiving the teachings of the present disclosure without departing from the scope thereof.

What is claimed is:

1. Method of etching comprising:
   preparing an etching solution containing hydrofluoric acid and nitric acid; and
   etching while adding nitrite ion to the etching solution.

2. Method of etching according to claim 1 in which: the etching solution further contains acetic acid.

3. Method of etching comprising:
   preparing an etching solution containing hydrofluoric acid and nitric acid; and
   etching while adding a medium for producing nitrite ion to the etching solution.

4. Method of etching according to claim 3 in which: the etching solution further contains acetic acid.

5. Method of etching according to claim 3 in which: the medium for producing nitrite ion contains silicon with a high impurity concentration.

6. Method of etching according to claim 3 in which: the medium for producing nitrite ion contains a mixed acid containing hydrofluoric acid and nitric acid having been used for dissolving a great amount of silicon.

7. Method of etching according to claim 3 in which: the medium for producing nitrite ion contains gaseous nitrogen dioxide.

8. Method of etching comprising:

preparing an etching solution containing hydrofluoric acid and nitric acid;

detecting the concentration of nitrite ion in the etching solution based on the concentration of $NO_x$ in the gas phase which is in an equilibrium relation to the nitrite ion in the liquid phase of the etching solution; and etching while adding nitrite ion to the etching solution based on the concentration of $NO_x$.

9. Method of etching according to claim 8 in which:

the concentration detection on $NO_x$ is carried out based on any one of controlled potential electrolysis method, infrared-absorbing analysis method, visible region absorptiometric method, and semiconductor method.

10. Method of etching according to claim 8 in which:

the gas and liquid phases of the etching solution are compulsorily introduced into a desired equilibrium relation by a carrier gas.

11. Method of etching comprising:

preparing an etching solution containing hydrofluoric acid and nitric acid;

detecting the concentration of nitrite ion in the etching solution based on the concentration of $NO_x$ in the gas phase which is in an equilibrium relation to the nitrite ion in the liquid phase of the etching solution; and etching while adding a medium for producing nitrite ion to the etching solution based on the concentration of $NO_x$.

12. Method of etching accodding to claim 11 in which:

the concentration detection on $NO_x$ is carried out based on any one of controlled potential electrolysis method, infrared-absorbing analysis method, visible region absorptiometric method, and semiconductor method.

13. Method of etching according to claim 11 in which:

the gas and liquid phases of the etching solution are compulsorily introduced into a desired equilibrium relation by a carrier gas.

* * * * *